US011716443B2

(12) United States Patent
Schemmann et al.

(10) Patent No.: US 11,716,443 B2
(45) Date of Patent: Aug. 1, 2023

(54) LC FILTERING WITH AUTO TUNING (71) Applicant: ARRIS Enterprises LLC, Suwanee, GA (US)

(72) Inventors: Marcel Franz Christian Schemmann, Maria Hoop (NL); Zoran Maricevic, West Hartford, CT (US); Zhijian Sun, Avon, CT (US); Eric Joseph Cormier, Bristol, CT (US)

(73) Assignee: ARRIS Enterprises LLC, Suwanee, GA (US)

( * ) Notice: Subject to any disclaimer, the term of this patent is extended or adjusted under 35 U.S.C. 154(b) by 187 days.

(21) Appl. No.: 17/208,718

(22) Filed: Mar. 22, 2021

(65) Prior Publication Data

US 2022/0303496 A1 Sep. 22, 2022

Related U.S. Application Data (60) Provisional application No. 62/993,261, filed on Mar. 23, 2020.

(51) Int. Cl.
*H04N 7/10* (2006.01)
*H04B 1/18* (2006.01)
*H04H 60/96* (2008.01)
*H03F 1/56* (2006.01)
*H03F 1/32* (2006.01)

(52) U.S. Cl.
CPC ............... *H04N 7/102* (2013.01); *H03F 1/32* (2013.01); *H03F 1/565* (2013.01); *H04B 1/18* (2013.01); *H04H 60/96* (2013.01)

(58) Field of Classification Search
CPC .......... H04N 7/102; H03F 1/32; H03F 1/565; H04B 1/18; H04H 60/96
See application file for complete search history.

(56) References Cited

U.S. PATENT DOCUMENTS

2017/0155425 A1* 6/2017 Gao ................. H04L 12/40104
2018/0288463 A1* 10/2018 Shapson ............. H04N 21/426
2020/0329262 A1* 10/2020 Bonen ................ H04N 21/6118

* cited by examiner

*Primary Examiner* — Chenea Davis
(74) *Attorney, Agent, or Firm* — Chernoff, Vilhauer, McClung & Stenzel, LLP (57) ABSTRACT

A radio-frequency amplifier for a cable network includes a forward amplifier configured to amplify a high frequency range of signals that are provided downstream to a cable receiver of the cable network and a return amplifier configured to amplify a low frequency range of signals that are provided upstream to a head end of the cable network. An out-of-band forward amplifier configured to amplify a digitally protected video signal having a frequency in a range between 70 MHz and 130 MHz that are provided downstream to the cable receiver of the cable network and a notch filter configured to reject the amplified digitally protected video signal having the frequency in the range between 70 MHz and 130 MHz from being amplified by the return amplifier.

26 Claims, 9 Drawing Sheets

LC FILTERING WITH AUTO TUNING

CROSS-REFERENCE TO RELATED APPLICATIONS

This application claims benefit of U.S. Provisional Patent Application No. 62/993,261 filed Mar. 23, 2020, which is incorporated herein by reference in its entirety.

BACKGROUND

The present disclosure relates to inductor-capacitor filtering with auto-tuning.

Figure 1:
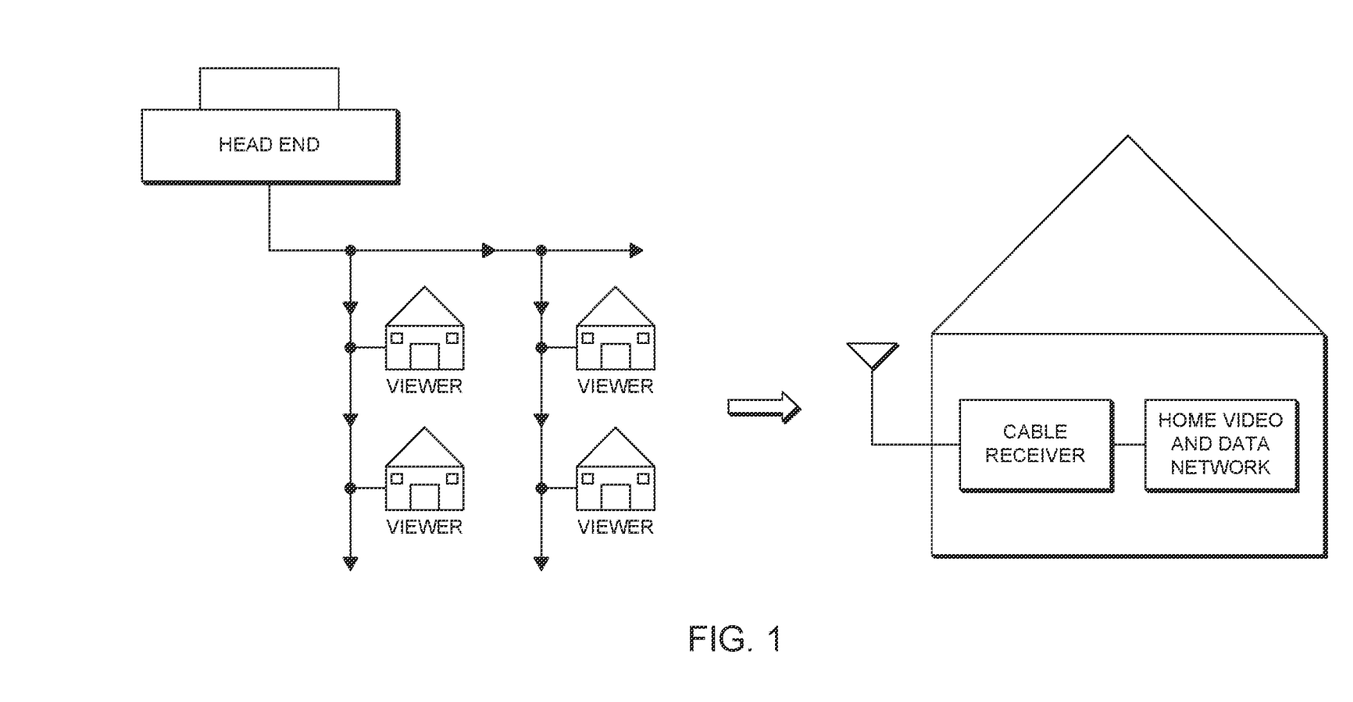
FIG. 1 shows an exemplary CATV network including a head end that delivers CATV content to a plurality of homes.

Referring to FIG. 1, cable TV (CATV) systems were initially deployed as video delivery systems. In its most basic form, the system received video signals at the cable head end, processed these for transmission and broadcast them to homes via a tree and branch coaxial cable network. In order to deliver multiple TV channels concurrently, early CATV systems assigned 6 MHz blocks of frequency to each channel and Frequency Division Multiplexed (FDM) the channels onto the coaxial cable RF signals. Amplifiers were inserted along the path as required to boost the signal and splitters and taps were deployed to enable the signals to reach the individual homes. Thus, all homes received the same broadcast signals.

As the reach of the systems increased, the signal distortion and operational cost associated with long chains of amplifiers became problematic and segments of the coaxial cable were replaced with fiber optic cables to create a Hybrid Fiber Coax (HFC) network to deliver the RF broadcast content to the coaxial neighborhood transmission network. Optical nodes in the network acted as optical-to-electrical converters to provide the fiber-to-coax interfaces.

As the cable network evolved, broadcast digital video signals were added to the multiplexed channels. The existing 6 MHz spacing for channels was retained but with the evolving technology, each 6 MHz block could now contain multiple programs. Up to this point, each home received the same set of signals broadcast from the head end so that the amount of spectrum required was purely a function of the total channel count in the program line-up.

The next major phase in CATV evolution was the addition of high speed data service, which is an IP packet-based service, but appears on the HFC network as another 6 MHz channel block (or given data service growth, more likely as multiple 6 MHz blocks). These blocks use FDM to share the spectrum along with video services. Unlike broadcast video, each IP stream is unique. Thus, the amount of spectrum required for data services is a function of the number of data users and the amount of content they are downloading. With the rise of Internet video, this spectrum is growing at 50% compound annual growth rate and putting significant pressure on transmission quality parameters such as available bandwidth, signal distortion, etc. Such pressure has been further increased with the advent of narrowcast video services such as video-on-demand (VOD), which changes the broadcast video model as users can select an individual program to watch and use VCR-like controls to start, stop, and fast-forward. In this case, as with data service, each user requires an individual program stream.

FIG. 1 shows part of the cable TV infrastructure which includes the cable head end, the Hybrid Fiber Coax (HFC) transmission network, and the home. The CATV head end receives incoming data and video signals from various sources (e.g., fiber optic links, CDN's, DBS satellites, local stations, etc.). The video signals are processed (reformatting, encryption, advertising insertion, etc.) and packaged to create the program line up for local distribution. This set of video programs is combined with data services and other system management signals and prepared for transmission over the HFC to the home. All information (video, data, and management) is delivered from the head end over the HFC network to the home as RF signals. In the current practice, systems in the head end process the signals, modulate them to create independent RF signals, combine these into a single broadband multiplex, and transmit this multiplex to the home. The signals (different video channels and one or more data and management channels) are transmitted concurrently over the plant at different FDM frequencies. In the home, a cable receiver decodes the incoming signal and routes it to TV sets or computers as required.

Cable receivers, including those integrated into set-top boxes and other such devices, typically receive this information from the head end via coaxial transmission cables. The RF signal that is delivered can simultaneously provide a wide variety of content, e.g. high-speed data service and up to several hundred television channels, together with ancillary data such as programming guide information, ticker feeds, score guides, etc. Through the cable receiver's output connection to the home network, the content is delivered to television sets, computers, and other devices. The head end will typically deliver CATV content to many thousands of individual households, each equipped with a compatible receiver.

Cable receivers are broadly available in many different hardware configurations. For example, an external cable receiver is often configured as a small box having one port connectable to a wall outlet delivering an RF signal, and one or more other ports connectable to appliances such as computers, televisions, and wireless routers or other network connections (e.g., 10/100/1,000 Mbps Ethernet). Other cable receivers are configured as circuit cards that may be inserted internally in a computer to similarly receive the signals from an RF wall outlet and deliver those signals to a computer, a television, or a network, etc. Still other cable receivers may be integrated into set-top boxes, which receive an input signal via an RF cable, decodes the RF signal to separate it into distinct channels or frequency bands providing individual content, and provides such content to a television or other audio or audiovisual device in a manner that permits users to each select among available content using the set-top box.

As previously mentioned, the CATV transmission architecture has been modified to permit data to flow in both directions, i.e. data may flow not only from the head end to the viewer, but also from the viewer to the head end. To achieve this functionality, cable operators dedicate one spectrum of frequencies to deliver forward path signals from the head end to the viewer, and another (typically much smaller) spectrum of frequencies to deliver return path signals from the viewer to the head end. The components in the cable network have been modified so that they are capable of separating the forward path signals from the return path signals, and separately amplifying the signals from each respective direction in their associated frequency range.

Figure 2:
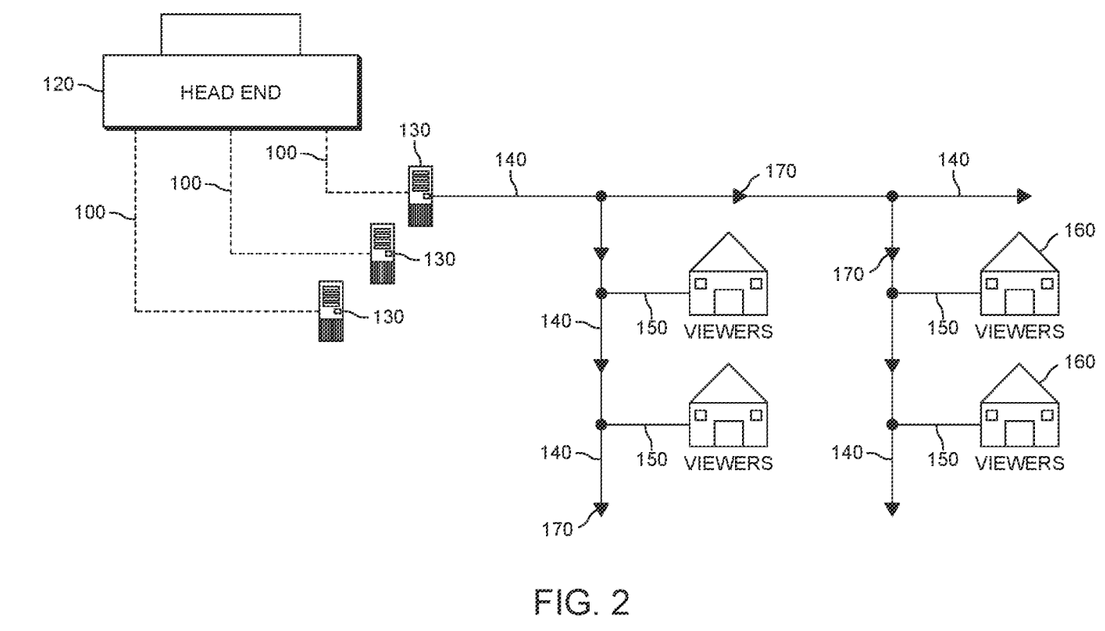
FIG. 2 shows an exemplary Hybrid Fiber Coax CATV network, including a head end that delivers CATV content to a plurality of homes.

FIG. 2 shows a Hybrid Fiber Coax (HFC) cable network. A head end system 120 includes multiple devices for delivery of video and data services including EdgeQAMS (EQAMs) for video, cable modem termination systems (CMTS) for data, and other processing devices for control and management. These systems are connected to multiple fiber optic cables 100 that go to various neighborhood locations that each serve a smaller community. A fiber optic neighborhood node 130 is located between each fiber optic cable 100 and a corresponding trunk cable 140, which in turn is interconnected to the homes 160 through branch networks and feeder cables 150. Because the trunk cable 140, as well as the branch networks and feeder cables 150, each propagate RF signals using coaxial cable, the nodes 130 convert the optical signals to electrical signals that can be transmitted through a coaxial medium, i.e. copper wire. Similarly, when electrical signals from the home reach the node 130 over the coaxial medium, those signals are converted to optical signals and transmitted across the fiber optic cables 100 back to the systems at the head end 120. The trunk cables 140 and/or feeder cables 150 may include amplifiers 170. Connected to each trunk cable 140 is a branch network that connects to feeder cables (or taps) that each enter individual homes to connect to a respective cable receiver. This is generally referred to as Fiber-to-the-Neighborhood (FTTN) or Fiber-to-the-Curb (FTTC), depending on how close the optical nodes are to the viewer's home.

Hybrid fiber coax networks generally have a bandwidth of approximately 500 MHz or more. Each television channel or other distinct content item transmitted along the forward path from the head end to a user may be assigned a separate frequency band, which as noted earlier has a typical spectral width of 6 MHz. Similarly, distinct content delivered along the return path from a user to the head end may similarly be assigned a separate frequency band, such as one having a spectral width of 6 MHz. In North America, the hybrid fiber coax networks assign the frequency spectrum between 5 MHz and 42 MHz to propagate signals along the return path and assign the frequency spectrum between 50 MHz and 750 MHz or more to propagate signals along the forward path.

Figure 3:
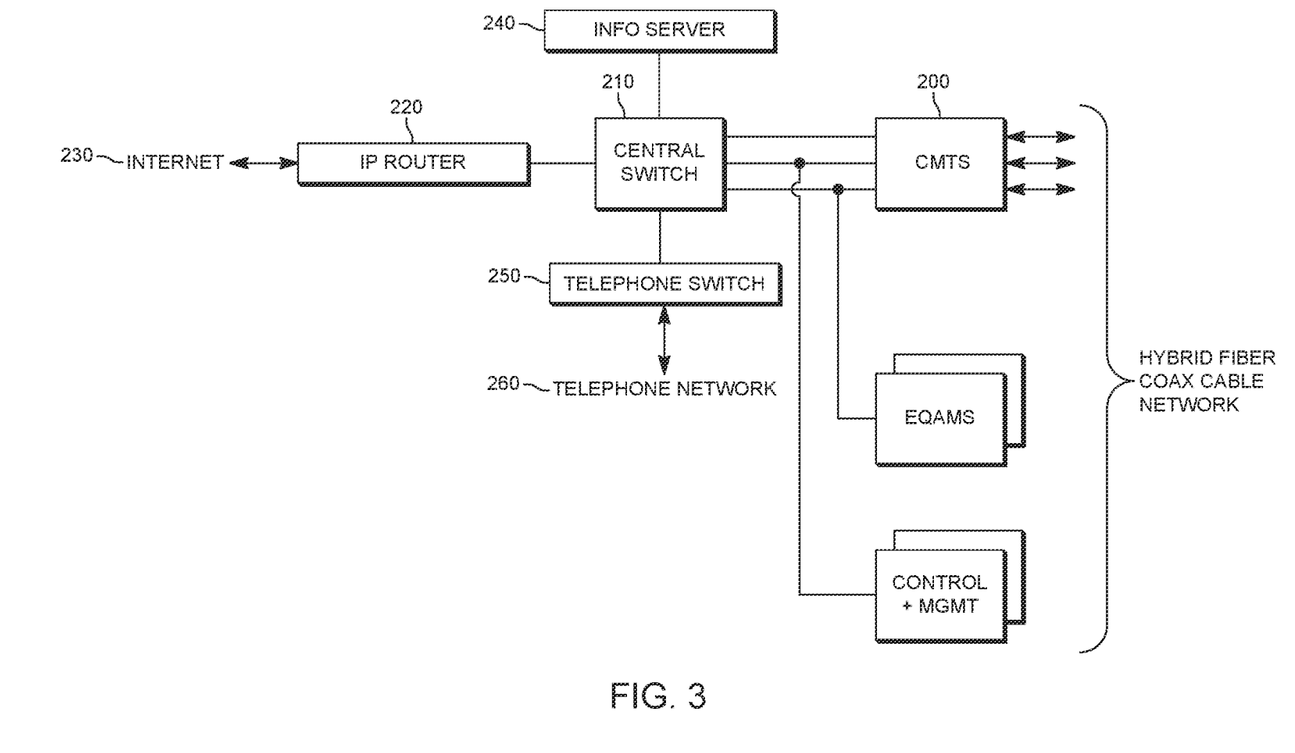
FIG. 3 shows an exemplary architecture of a head end, such as the ones shown in FIGS. 1 and 2.

Referring to FIG. 3, a cable modem termination system (CMTS) 200 may be installed at the head end, which instructs each of the cable modems when to transmit return path signals, such as Internet protocol (IP) based signals, and which frequency bands to use for return path transmissions. The CMTS 200 demodulates the return path signals, translates them back into (IP) packets, and redirects them to a central switch 210. The central switch 210 redirects the IP packets to an IP router 220 for transmission across the Internet 230, and to the CMTS which modulates forward path signals for transmission across the hybrid fiber coax cables to the user's cable modem. The central switch 210 also sends information to, and receives information from, information servers 240 such as video servers. The central switch 210 also sends information to, and receives information from, a telephone switch 250 which is interconnected to the telephone network 260. In general, cable modems are designed to only receive from, and send signals to, the CMTS 200, and may not communicate directly with other cable modems networked through the head end.

Using this architecture, forward path signals from the head-end are broadcast to all cable modem users on the same network or sub-network. Each cable modem filters out the portion of the signal it needs, which may then be selectively provided to the user. Along the return path, each cable modem delivers a signal to the head end through the CATV network, and which occupies a part of a spectrum shared among other cable modems. Therefore, the system may regulate which modem's return path signal is delivered to the network at which time using time or frequency division multiple access (TDMA or FDMA).

DETAILED DESCRIPTION

Figure 4:
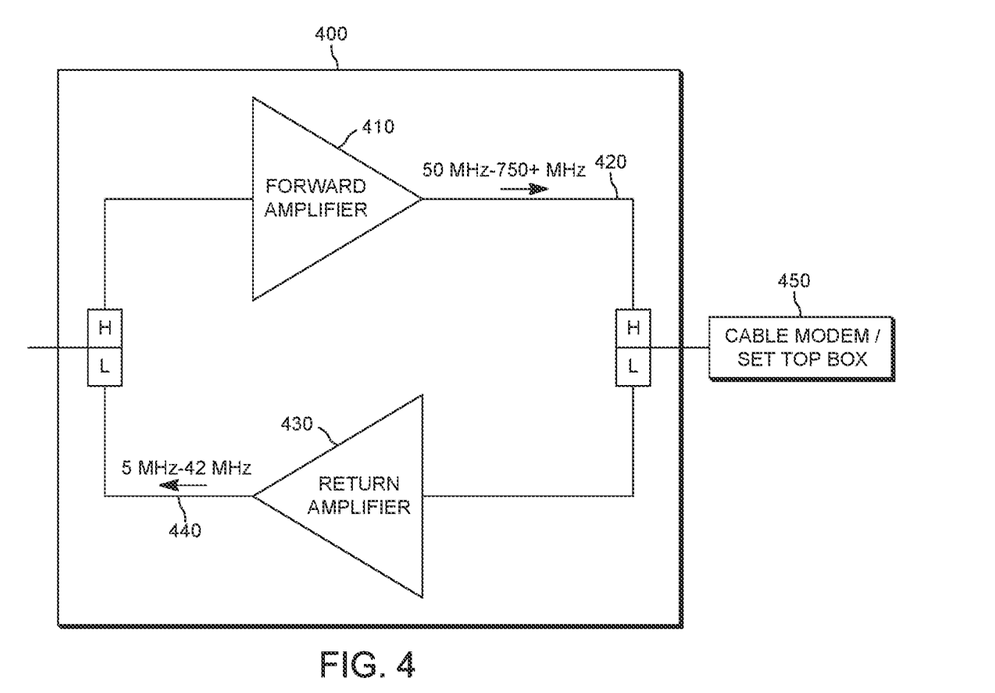
FIG. 4 shows an exemplary radio-frequency amplifier for a cable system.

Referring to FIG. 4, an RF amplifier 400 suitable for a hybrid fiber coaxial network supports propagating signals through a forward amplifier 410 on both a forward path between 50 MHz and 750 MHz or more 420 and a return path through a return amplifier 430 between 5 MHz and 42 MHz 440. The split between upstream and downstream may be referred to as a 42 MHz/50 MHz split. In general, there may be considered a high frequency forward path "H" (i.e., downstream) to the cable receiver 450 and a low frequency return path "L" (i.e., upstream) from the cable receiver 450. In this manner, the RF amplifier separates the forward/downstream communication path from the reverse/upstream path. This separation prevents interference between the downstream and upstream signals.

Figure 5:
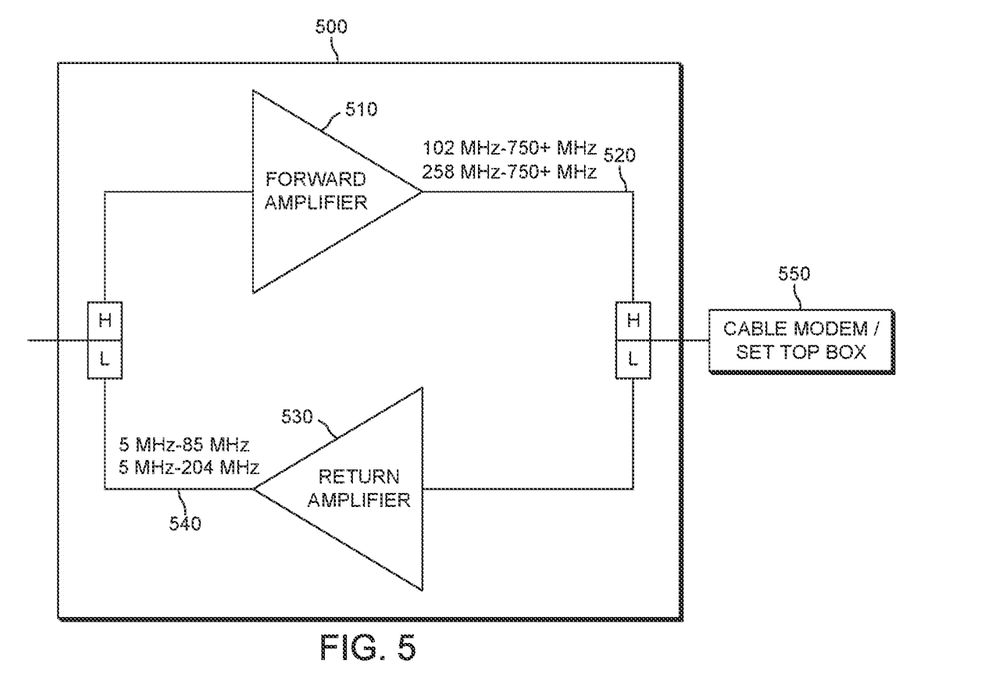
FIG. 5 shows a modified exemplary radio-frequency amplifier for a cable system.

Referring to FIG. 5, it is often desirable to modify the split between the downstream path and the upstream path to a higher frequency range to accommodate additional bandwidth for the cable receivers to provide upstream data. For example, to accommodate additional upstream bandwidth the split between the upstream and downstream may be modified to 85 MHz/102 MHz or 204 MHz/258 MHz split. The modified RF amplifier 500 suitable for a hybrid fiber coaxial network supports propagating signals through a forward amplifier 510 on both a forward path between 102 MHz or 258 MHz and 750 MHz or more 520 and a return path through a return amplifier 530 between 5 MHz and 85 MHz or 204 MHz 540. In general, there may be considered a high frequency forward path (i.e., downstream) to the cable receiver 550 and a low frequency return path (i.e., upstream) from the cable receiver 550.

While the RF amplifier illustrated in FIG. 5 provides an increased upstream bandwidth for the cable receiver, legacy cable receivers often include an out-of-band (OOB) forward data communication channel, which has a bandwidth of 1 MHz to 2 MHz in the frequency range from 70 MHz to 130 MHz. This out-of-band (OOB) forward data communication channel in the frequency range from 70 MHz to 130 MHz is used for digitally protected video signals, such as at 104 MHz. The cable receiver 550 is configured to receive such digitally protected video signals at a designated frequency. Unfortunately, modification of the RF amplifier to use a higher split frequency than the traditional 42 MHz/50 MHz split, results in the digitally protected video signals in the range of 70 MHz to 130 MHz likely not being amplified by the forward amplifier 510. This is especially the case with the digitally protected video signals being at 104 MHz (i.e., downstream path) and the 204 MHz/258 MHz split for the upstream path and downstream path, where the digitally protected video signals that are intended to be in the forward path would be in the bandwidth of the return path.

Figure 6:
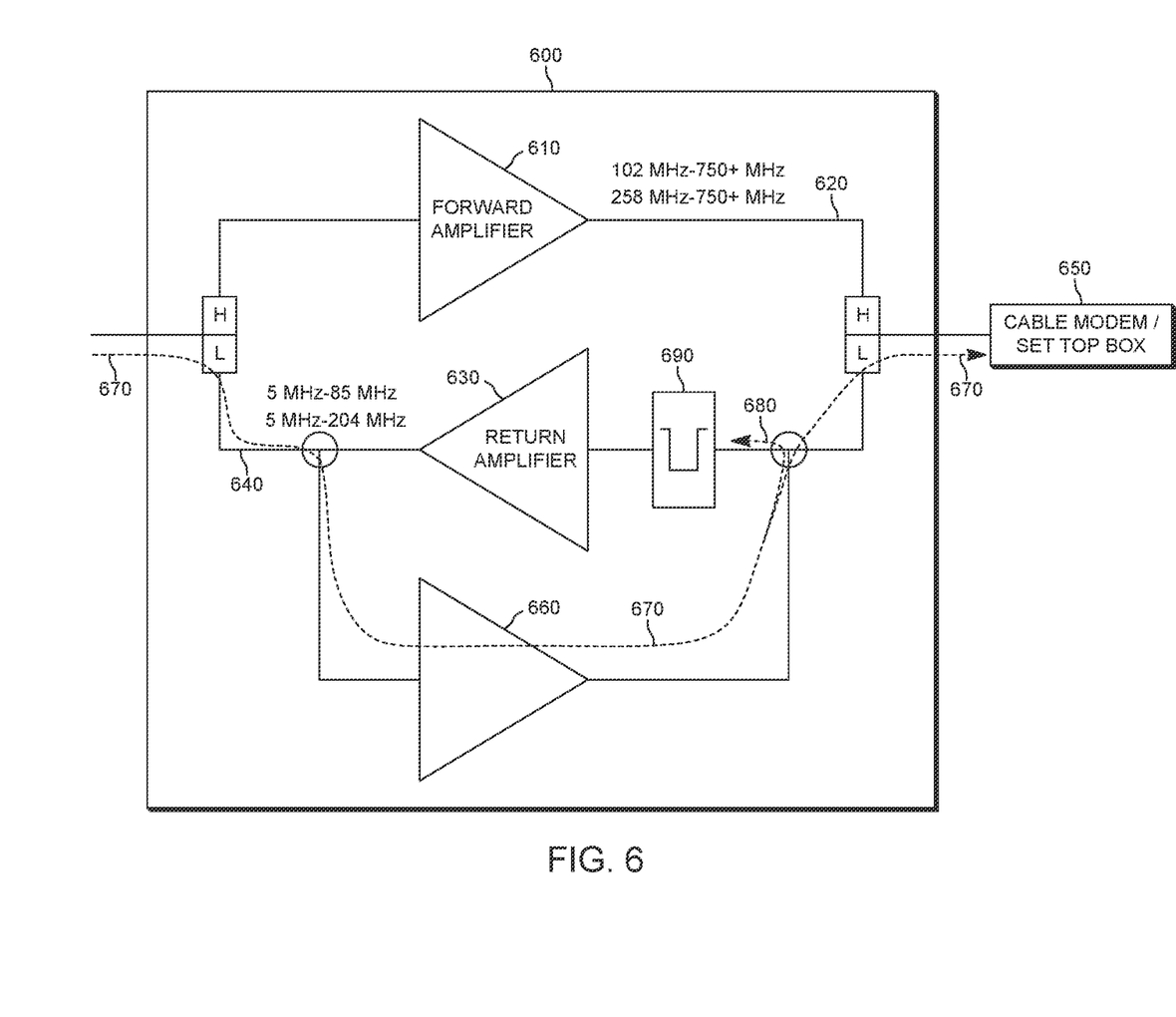
FIG. 6 shows a further modified exemplary radio-frequency amplifier for a cable system.

Referring to FIG. 6, a modified RF amplifier permits legacy cable receivers 650 that are configured to receive digitally protected video signals in the range of 70 MHz to 130 MHz to be used together with the modified higher split frequency than the traditional 42 MHz/50 MHz split. The modified RF amplifier 600 suitable for a hybrid fiber coaxial network supports propagating signals through a forward amplifier 610 on both a forward path between 102 MHz or 258 MHz and 750 MHz or more 620 and a return path through a return amplifier 630 between 5 MHz and 85 MHz or 204 MHz 640. In general, there may be considered a high frequency forward path (i.e., downstream) to the cable receiver 650 and a low frequency return path (i.e., upstream) from the cable receiver 650. A downstream narrow band amplifier 660 may be included, that amplifies the digitally protected video signals in the range of 70 MHz to 130 MHz, such as 104 MHz. With the additional downstream narrow band amplifier 660 the digitally protected video signals may pass through the RF amplifier in a downstream direction, as generally indicated by the arrow 670. The digitally protected video signals may result in feedback into the return amplifier 630 as indicated by the arrow 680. To inhibit the feedback into the return amplifier 630, a notch filter 690 (e.g., a band rejection filter) may be included to filter out the feedback signal. In this manner, the OOB channel is picked up before the return amplifier 630, the OOB channel is amplified 660, and the OOB channel is inserted back after the return amplifier 630. Accordingly, a downstream signal is provided by the RF amplifier 600 with a first frequency range that further includes a downstream frequency range (e.g., 2 MHz wide) that includes the digitally protected video signals. Likewise, an upstream signal is provided by the RF amplifier 600 with a second frequency range that omits the downstream frequency range (e.g., 2 MHz wide) that includes the digitally protected video signals.

To maximize the return path bandwidth, the notch filter 690 should be as narrow as reasonably possible, while also maintaining generally 50 dB rejection ratio or more for the OOB signal. One manner of designing a notch filter is to use an inductor-capacitor based filter that includes only air coils for the inductors. In general, air cores are inductors that do not use a magnetic core made of a ferromagnetic material. Such air cores include conductive coils wound on plastic, ceramic, or other non-magnetic forms, inclusive of having air inside the windings. While such air coils have relatively low energy losses, they also tend to have relatively low inductance, such as no more than generally 500 nH ($10^{-9}$ Henry). The design of an inductor-capacitor based notch filter using only inductors having no more inductance than generally 500 nH results in a relatively wide rejection ratio for a range of frequencies in the range of 70 MHz to 130 MHz, inclusive of 104 MHz. Moreover, air coils are tuned by physically spreading the wires of the air coil, which is problematic and prone to drift over time. In addition, such air coils tend to be relatively bulky, which is problematic for a RF amplifier in a cable system, where suitable space may not be available.

Figure 7:
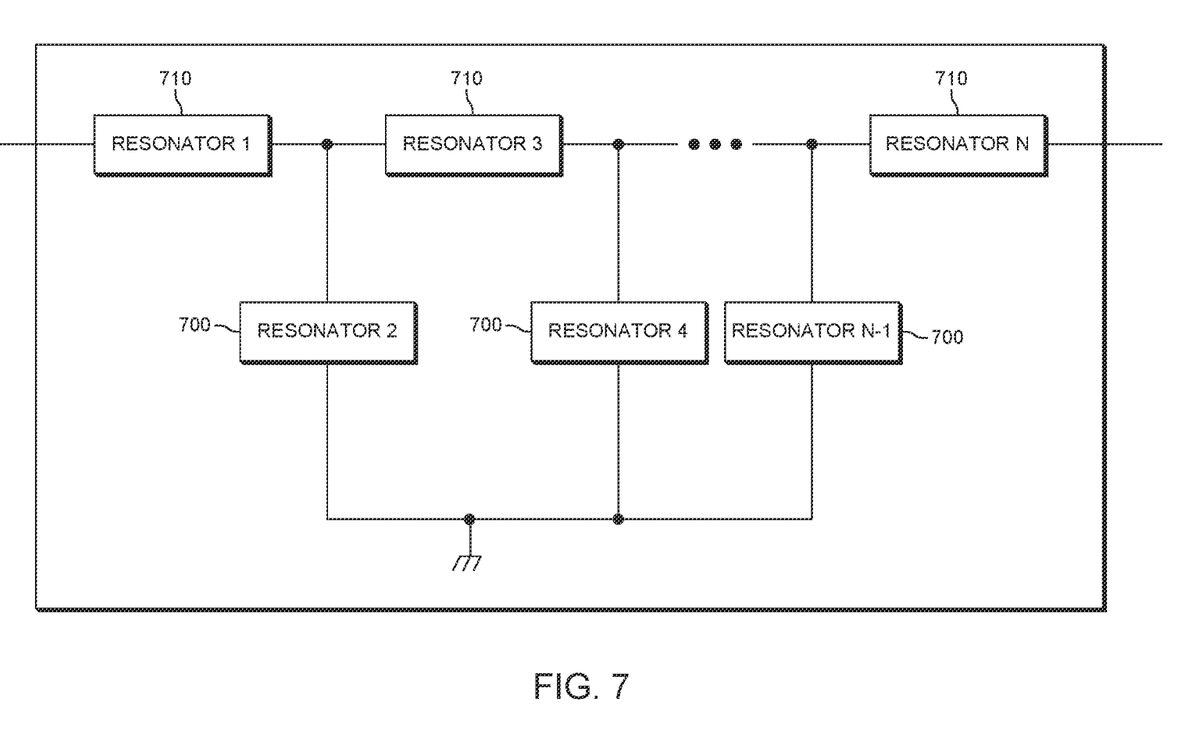
FIG. 7 shows an exemplary inductor-capacitor filter for a radio-frequency amplifier of FIG. 6.

Referring to FIG. 7, an inductor-capacitor based filter suitable for a RF amplifier may include an inductor-capacitor network that includes a combination of parallel resonators 710 (inductor in parallel with a capacitor) and series resonators 700 (inductor in series with a capacitor). The arrangement of the parallel resonators and the series resonators may be modified, as desired, for the particular inductor-capacitor network. In order to accommodate the requirements of a high performance cable network, it is desirable to have a notch filter that has an exclusion zone of 24 MHz or less, with 50 dB or greater rejection for the OOB signal, and 2 dB or less insertion loss for the passband signal. To accommodate such a sharp rejection filter the series resonator preferably includes an inductor that has sufficiently large inductance, such as an inductance of at least 1 uH. Preferably, the series resonator includes an inductor that has an inductance of 1.2 uH or more to 1.5 uH or less. Preferably, the inductor of the series resonator is a surface mounted device with a ceramic core. Moreover, such surface mounted devices tend to have a relatively small footprint on a printed circuit board, especially in comparison to air coils. To accommodate such a sharp rejection filter, the parallel resonator preferably includes an inductor that has sufficiently small inductance, such as an inductance less than 100 nH. Preferably, the parallel resonator includes an inductor that has an inductance of 10 nH or more to 20 nH or less. Preferably, the inductor of the parallel resonator is a surface mounted device with an air core.

Each of the resonance parallel or series inductor-capacitor based circuits includes one or more capacitors. The resonance of a parallel or a series inductor-capacitor based circuit depends on the particular value of the capacitance and the particular value of the inductance. Discrete component-based inductors, such as tightly compressed surface mounted devices, tend to have non-insubstantial variability in inductance from device to device. Also, such surface mounted inductors do not have coils that are modified to tune the inductor and are therefore more stable over time. The variability of the inductance tends to modify the circuit characteristics sufficiently resulting in it being problematic having a sufficiently sharp rejection filter at a desired center frequency. To accommodate such variability in the inductance it is desirable to include at least one varactor which has a variable capacitance in a plurality of such inductor-capacitor circuits, and more preferably all of the inductor-capacitor circuits, to adjust the resonant frequency of the respective inductor-capacitor circuit. The varactor is a voltage-controlled capacitance, where the capacitance varies based upon an analog signal level, where modification of the capacitance of the varactor modifies the resonance of the corresponding inductor-capacitor circuit.

Figure 8:
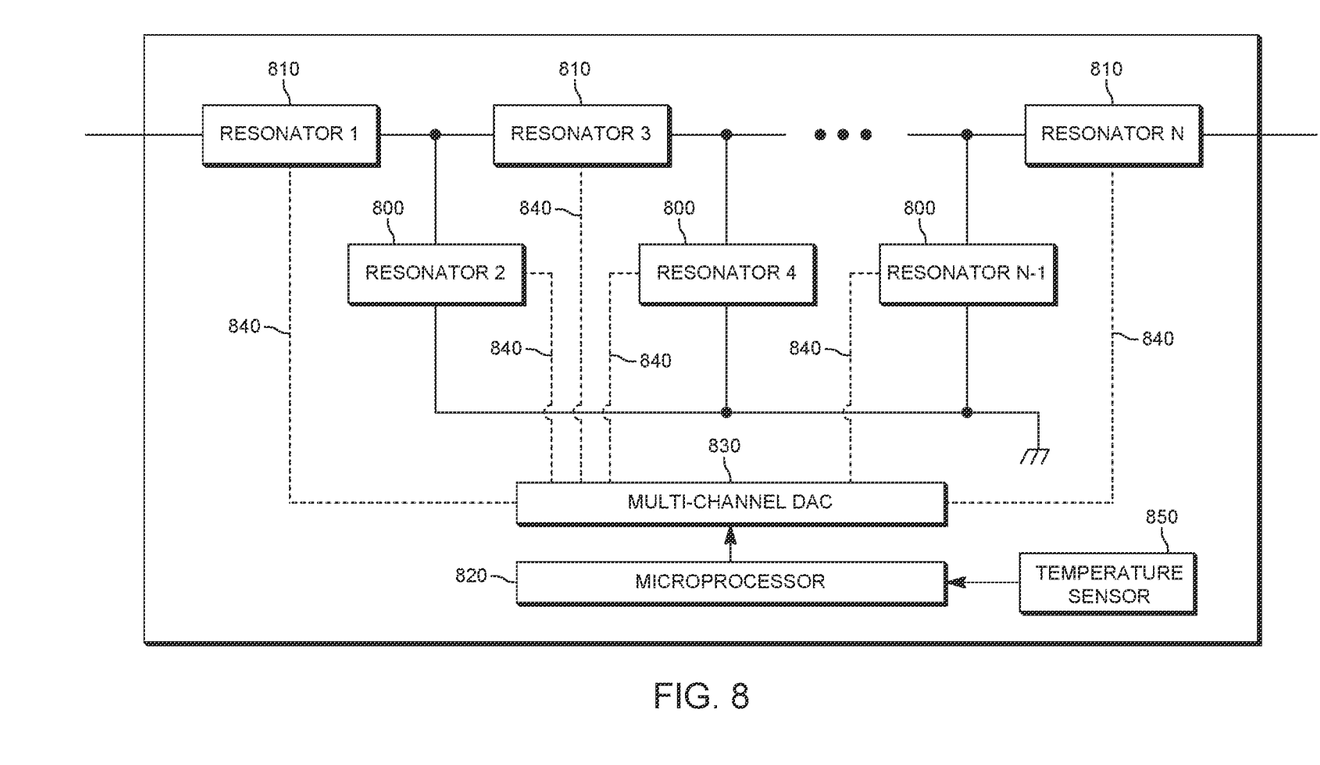
FIG. 8 shows another exemplary inductor-capacitor filter for a radio-frequency amplifier of FIG. 6.

Referring to FIG. 8, a modified inductor-capacitor based filter suitable for a RF amplifier may include an inductor-capacitor network that includes a combination of parallel resonators 810 (inductor in parallel with a capacitor) and series resonators 800 (inductor in series with a capacitor). The arrangement of the parallel resonators and the series resonators may be modified, as desired, for the particular inductor-capacitor network. A microprocessor 820 is interconnected to a multi-channel digital-to-analog converter 830 in a manner that the microprocessor 820 can provide a suitable digital signal to a corresponding digital-to-analog converter 830 to provide a corresponding analog output 840 to a corresponding varactor of a respective resonator 800, 810. By modification of the corresponding value from the microprocessor 820 the value of the corresponding varactor of the resonator 800, 810 may be modified, which modifies the resonant frequency of the resonator(s). By providing suitable values from the microprocessor 820 the resonant frequencies of the corresponding resonators may be modified. With the filter being included within a location exposed to the environment, the filter tends to vary its characteristics as the temperature changes, such as temperature variations associated with cold winters and hot summers. A temperature sensor 850 may be included that senses the ambient temperature proximate the filter and provides a signal that indicates the ambient temperature to the microprocessor 820. The microprocessor 820 in turn modifies its outputs to change the characteristics of the filter, such that it compensates for the modified temperature.

The filter may include microprocessor-based auto-tuning, after being tuned, which may be further auto-tuned based upon the temperature sensor. The selection of the number of inductor-capacitor resonators may be selected based upon filter rejection and group delay ripple requirements.

Figure 9:
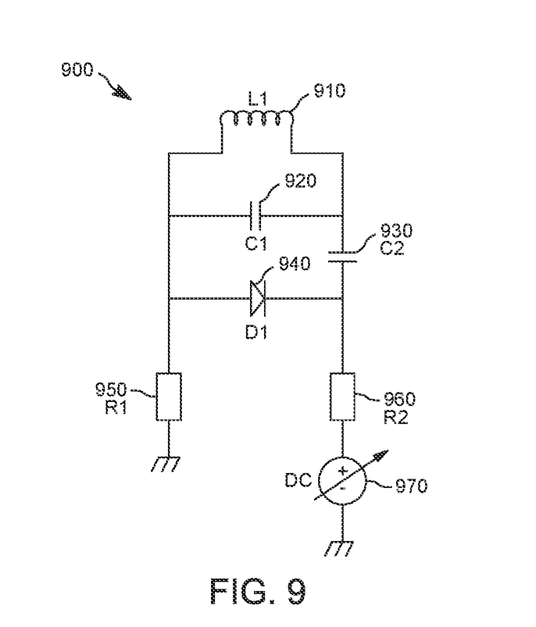
FIG. 9 shows an exemplary parallel inductor-capacitor resonator for the inductor-capacitor filter of FIG. 7 and FIG. 8.

Referring to FIG. 9, an exemplary parallel resonator 900 is shown. The parallel resonator 900 includes an inductor L1 910. The parallel resonator 900 includes a fixed value capacitor C1 920, a fixed capacitor C2 930, a first resistor R1 950, and a second resistor R2 960. The parallel resonator 900 includes a varactor 940 which has a capacitance value that is adjustable based upon a bias input 970 from the multi-channel DAC 830. Adjustment of the bias input 970 adjusts the capacitance of the varactor 940 which adjusts the resonant frequency of the parallel resonator 900. The majority of the capacitance comes from the fixed capacitor C1 920, where the varactor 940 arranged in parallel preferably accounts for less than 10 percent of the total capacitance. With such a ratio between the fixed capacitor C1 920 and the capacitance of the varactor 940, the non-ideal Q of the varactor will not substantially affect the sharpness of the parallel resonator 900.

Figure 10:
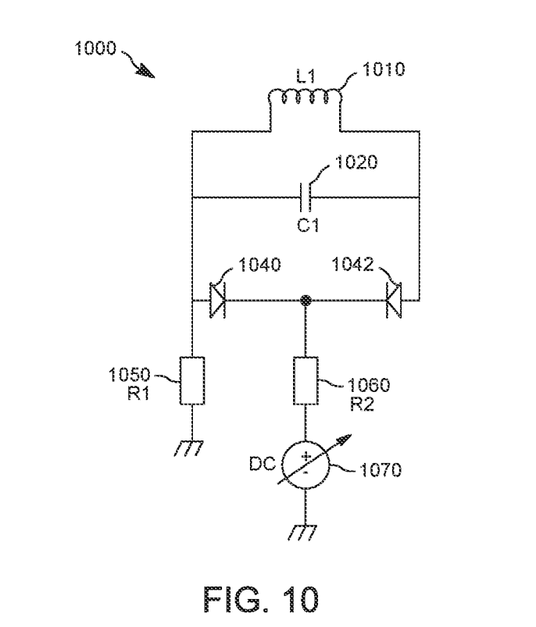
FIG. 10 shows another exemplary parallel inductor-capacitor resonator for the inductor-capacitor filter of FIG. 7 and FIG. 8.

Referring to FIG. 10, an exemplary parallel resonator 1000 is shown. The parallel resonator 1000 includes an inductor L1 1010. The parallel resonator 1000 includes a fixed value capacitor C1 1020, a first resistor R1 1050, and a second resistor R2 1060. The parallel resonator 1000 includes a pair of varactors 1040, 1042 which has a capacitance value that is adjustable based upon a bias input 1070 from the multi-channel DAC 830. Adjustment of the bias input 1070 adjusts the capacitance of the varactors 1040, 1042 which adjusts the resonant frequency of the parallel resonator 1000. The majority of the capacitance comes from the fixed capacitor C1 1020, where the varactors 1040, 1042 arranged in parallel preferably accounts for less than 10 percent of the total capacitance. With such a ratio between the fixed capacitor C1 1020 and the capacitance of the varactors 1040, 1042, the non-ideal Q of the varactors will not substantially affect the sharpness of the parallel resonator 1000.

Figure 11:
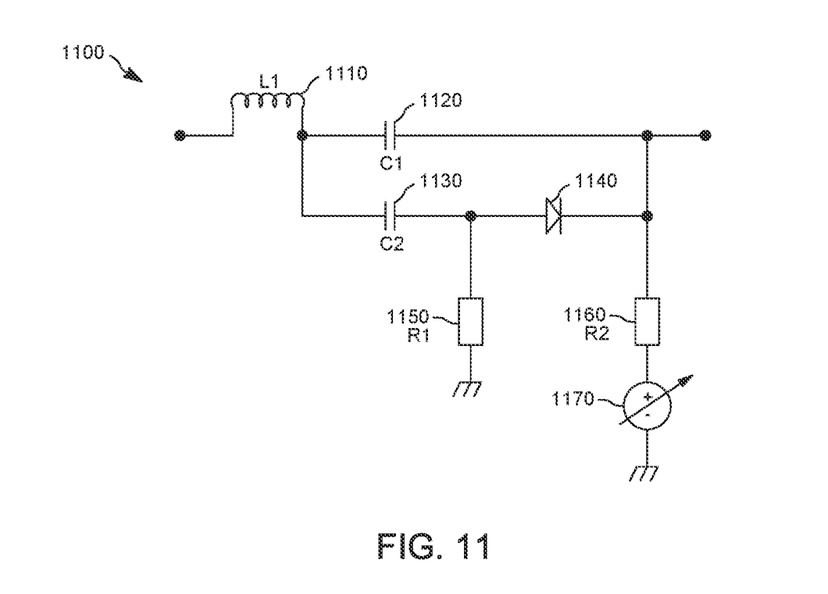
FIG. 11 shows an exemplary series inductor-capacitor resonator for the inductor-capacitor filter of FIG. 7 and FIG. 8.

Referring to FIG. 11, an exemplary series resonator 1100 is shown. The series resonator 1100 includes an inductor L1 1110. The series resonator 1100 includes a fixed value capacitor C1 1120, a fixed capacitor C2 1130, a first resistor R1 1150, and a second resistor R2 1160. The series resonator 1100 includes a varactor 1140 which has a capacitance value that is adjustable based upon a bias input 1170 from the multi-channel DAC 830. Adjustment of the bias input 1170 adjusts the capacitance of the varactor 1140 which adjusts the resonant frequency of the parallel resonator 1100. The majority of the capacitance comes from the fixed capacitor C1 1120, where the varactor 1140 arranged in parallel preferably accounts for less than 10 percent of the total capacitance. With such a ratio between the fixed capacitor C1 1120 and the capacitance of the varactor 1140, the non-ideal Q of the varactor will not substantially affect the sharpness of the parallel resonator 1100.

Figure 12:
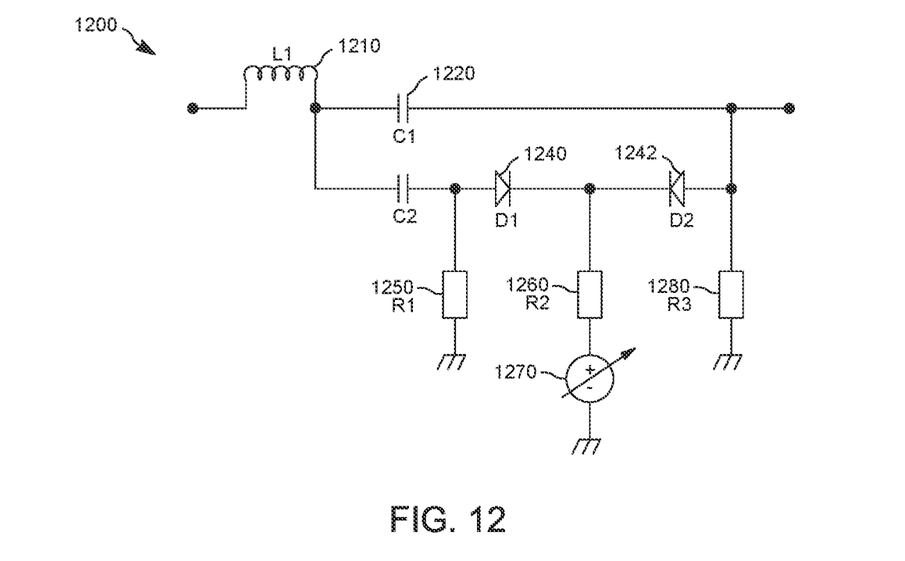
FIG. 12 shows another exemplary series inductor-capacitor resonator for the inductor-capacitor filter of FIG. 7 and FIG. 8.

Referring to FIG. 12, an exemplary series resonator 1200 is shown. The series resonator 1200 includes an inductor L1 1210. The series resonator 1200 includes a fixed value capacitor C1 1220, a first resistor R1 1250, a second resistor R2 1260, and a third resistor R3 1280. The series resonator 1200 includes a pair of varactors 1240, 1242 which has a capacitance value that is adjustable based upon a bias input 1270 from the multi-channel DAC 830. Adjustment of the bias input 1270 adjusts the capacitance of the varactors 1240, 1242 which adjusts the resonant frequency of the series resonator 1200. The majority of the capacitance comes from the fixed capacitor C1 1220, where the varactors 1040, 1042 arranged in parallel preferably accounts for less than 10 percent of the total capacitance. With such a ratio between the fixed capacitor C1 1220 and the capacitance of the varactors 1240, 1242, the non-ideal Q of the varactors will not substantially affect the sharpness of the series resonator 1200.

As it may be observed, the combination of fixed capacitance capacitor and variable capacitance varactors, permits for example, 2-10 pF changes in the varactors to modify the overall capacitance by a much finer range, such as fractions of 1 pF. Such fine controllability of the overall capacitance enables fine tuning of the resonance frequency.

The terms and expressions that have been employed in the foregoing specification are used therein as terms of description and not of limitation, and there is no intention, in the use of such terms and expressions, of excluding equivalents of the features shown and described or portions thereof, it being recognized that the scope of the claimed subject matter is defined and limited only by the claims that follow.

We claim:

1. A radio-frequency amplifier for a cable network comprising:
   (a) a forward amplifier configured to amplify a high frequency range of signals that are provided downstream to a cable receiver of said cable network;
   (b) a return amplifier configured to amplify a low frequency range of signals that are provided upstream to a head end of said cable network;
   (c) an out-of-band forward amplifier configured to amplify a digitally protected video signal having a frequency in a range between 70 MHz and 130 MHz that are provided downstream to said cable receiver of said cable network;
   (d) a notch filter configured to reject said amplified said digitally protected video signal having said frequency in said range between 70 MHz and 130 MHz from being amplified by said return amplifier;
   (e) said radio-frequency amplifier providing said high frequency range of signals together with said amplified digitally protected video signal to said cable receiver; and
   (f) said radio-frequency amplifier providing said low frequency range of signals without said frequencies rejected by said notch filter to said head end of said cable network, wherein said notch filter has a rejection range of no more than 24 MHz wide with at least 50 dB rejection for said digitally protected video signal.

2. The radio-frequency amplifier for said cable network of claim 1 wherein said digitally protected video signal includes 104 MHz.

3. The radio-frequency amplifier for said cable network of claim 1 wherein said high frequency range of signals includes 102 MHz to at least 750 MHz.

4. The radio-frequency amplifier for said cable network of claim 1 wherein said high frequency range of signals includes 258 MHz to at least 750 MHz.

5. The radio-frequency amplifier for said cable network of claim 1 wherein said low frequency range of signals includes 5 MHz to no more than 85 MHz.

6. The radio-frequency amplifier for said cable network of claim 1 wherein said low frequency range of signals includes 5 MHz to no more than 204 MHz.

7. The radio-frequency amplifier for said cable network of claim 1 wherein said digitally protected video signal includes 104 MHz, said high frequency range of signals includes 258 MHz to at least 750 MHz, and said low frequency range of signals includes 5 MHz to no more than 204 MHz.

8. The radio-frequency amplifier for said cable network of claim 1 wherein said notch filter includes no more than 2 dB insertion loss for a passband signal through said notch filter.

9. The radio-frequency amplifier for said cable network of claim 1 wherein said notch filter includes a plurality of inductor-capacitor resonators.

10. The radio-frequency amplifier for said cable network of claim 9 wherein a first one of said inductor-capacitor resonators includes a series inductor-capacitor resonator including a first inductor and a first capacitor, wherein a second one of said inductor-capacitor resonators includes a parallel inductor-capacitor resonator including a second inductor and a second capacitor.

11. The radio-frequency amplifier for said cable network of claim 10 wherein said first inductor of said series inductor-capacitor resonator has an inductance of at least 1 uH.

12. The radio-frequency amplifier for said cable network of claim 11 wherein said first inductor of said series inductor-capacitor resonator is a surface mounted device with a ceramic core.

13. The radio-frequency amplifier for said cable network of claim 10 wherein said second inductor of said parallel inductor-capacitor resonator has an inductance of less than 100 nH.

14. The radio-frequency amplifier for said cable network of claim 13 wherein said second inductor of said parallel inductor-capacitor resonator is a surface mounted device with an air coil.

15. The radio-frequency amplifier for said cable network of claim 10 wherein said first capacitor of said series inductor-capacitor resonator is a first varactor having a voltage-controlled capacitance.

16. The radio-frequency amplifier for said cable network of claim 15 wherein said second capacitor of said parallel inductor-capacitor resonator is a second varactor having a voltage-controlled capacitance.

17. The radio-frequency amplifier for said cable network of claim 10 wherein said first inductor of said series inductor-capacitor resonator has an inductance of at least 1 uH, wherein said second inductor of said parallel inductor-capacitor resonator has an inductance of less than 100 nH, wherein said first capacitor of said series inductor-capacitor resonator is a first varactor having a voltage controlled capacitance, wherein said second capacitor of said parallel inductor-capacitor resonator is a second varactor having a voltage controlled capacitance.

18. The radio-frequency amplifier for said cable network of claim 17 further comprising a processor providing a first signal to control a first voltage to be applied to said first varactor and a second signal to control a second voltage be applied to said second varactor.

19. The radio-frequency amplifier for said cable network of claim 18 further comprising a temperature sensor sensing an ambient temperature and said processor modifying said first voltage and said second voltage in response to a signal from said temperature sensor.

20. A radio-frequency amplifier for a cable network comprising:
   (a) a forward amplifier configured to amplify a high frequency range of signals that are provided downstream to a cable receiver of said cable network;
   (b) a return amplifier configured to amplify a low frequency range of signals that are provided upstream to a head end of said cable network;
   (c) an out-of-band forward amplifier configured to amplify a digitally protected video signal having a frequency in a range between 70 MHz and 130 MHz that are provided downstream to said cable receiver of said cable network;
   (d) a notch filter configured to reject said amplified said digitally protected video signal having said frequency in said range between 70 MHz and 130 MHz from being amplified by said return amplifier;
   (e) said radio-frequency amplifier providing said high frequency range of signals together with said amplified digitally protected video signal to said cable receiver; and
   (f) said radio-frequency amplifier providing said low frequency range of signals without said frequencies rejected by said notch filter to said head end of said cable network, wherein said digitally protected video signal includes 104 MHz.

21. The radio-frequency amplifier for said cable network of claim 20 wherein said high frequency range of signals includes 102 MHz to at least 750 MHz.

22. The radio-frequency amplifier for said cable network of claim 20 wherein said high frequency range of signals includes 258 MHz to at least 750 MHz.

23. The radio-frequency amplifier for said cable network of claim 20 wherein said low frequency range of signals includes 5 MHz to no more than 85 MHz.

24. The radio-frequency amplifier for said cable network of claim 20 wherein said low frequency range of signals includes 5 MHz to no more than 204 MHz.

25. A radio-frequency amplifier for a cable network comprising:
   (a) a forward amplifier configured to amplify a high frequency range of signals that are provided downstream to a cable receiver of said cable network;
   (b) a return amplifier configured to amplify a low frequency range of signals that are provided upstream to a head end of said cable network;
   (c) an out-of-band forward amplifier configured to amplify a digitally protected video signal having a frequency in a range between 70 MHz and 130 MHz that are provided downstream to said cable receiver of said cable network;
   (d) a notch filter configured to reject said amplified said digitally protected video signal having said frequency in said range between 70 MHz and 130 MHz from being amplified by said return amplifier;

(e) said radio-frequency amplifier providing said high frequency range of signals together with said amplified digitally protected video signal to said cable receiver; and (f) said radio-frequency amplifier providing said low frequency range of signals without said frequencies rejected by said notch filter to said head end of said cable network, wherein said digitally protected video signal includes 104 MHz, said high frequency range of signals includes 258 MHz to at least 750 MHz, and said low frequency range of signals includes 5 MHz to no more than 204 MHz.

26. A radio-frequency amplifier for a cable network comprising:

(a) a forward amplifier configured to amplify a high frequency range of signals that are provided downstream to a cable receiver of said cable network;

(b) a return amplifier configured to amplify a low frequency range of signals that are provided upstream to a head end of said cable network;

(c) an out-of-band forward amplifier configured to amplify a digitally protected video signal having a frequency in a range between 70 MHz and 130 MHz that are provided downstream to said cable receiver of said cable network;

(d) a notch filter configured to reject said amplified said digitally protected video signal having said frequency in said range between 70 MHz and 130 MHz from being amplified by said return amplifier;

(e) said radio-frequency amplifier providing said high frequency range of signals together with said amplified digitally protected video signal to said cable receiver; and (f) said radio-frequency amplifier providing said low frequency range of signals without said frequencies rejected by said notch filter to said head end of said cable network, wherein said notch filter includes at least a 50 dB rejection ratio for said digitally protected video signal and no more than 2 dB insertion loss for a passband signal through said notch filter.

* * * * *